United States Patent [19]

Takuma

[11] Patent Number: 5,285,463
[45] Date of Patent: Feb. 8, 1994

[54] SEMICONDUCTOR DEVICE

[75] Inventor: Hiroaki Takuma, Kyoto, Japan

[73] Assignee: Rohm Co., Ltd., Kyoto, Japan

[21] Appl. No.: 983,956

[22] Filed: Dec. 1, 1992

[30] Foreign Application Priority Data

Dec. 3, 1991 [JP] Japan .................. 3-348166
Nov. 5, 1992 [JP] Japan .................. 4-296043

[51] Int. Cl.$^5$ .............................................. H01S 3/045
[52] U.S. Cl. ........................................................ 372/36
[58] Field of Search ........................ 372/36, 35, 34, 43

[56] References Cited

U.S. PATENT DOCUMENTS 4,546,478 10/1985 Shimizu et al. ................. 372/36
4,628,514 12/1986 Dorn et al. ...................... 372/36

FOREIGN PATENT DOCUMENTS 0193084 11/1982 Japan ..................... 372/36
0052079 3/1985 Japan ..................... 372/36

Primary Examiner—Georgia Y. Epps
Attorney, Agent, or Firm—Lowe, Price, LeBlanc & Becker

[57] ABSTRACT

The present invention provides a semiconductor device wherein a semiconductor chip is fixed on a mount body without a short circuit. A positive electrode (42) is provided above a conductive substrate through an insulating layer (38). The electrode (42) have a concavity (43). A bonding connector consists a first bonding connector (70) on the electrode (42) and a second bonding connector (71) around the first bonding connector (70), the first bonding connector being more fluid than the second bonding connector at a certain temperature. A LASER chip (30) is fixed on the second bonding connector (71).

20 Claims, 12 Drawing Sheets

SEMICONDUCTOR DEVICE

BACKGROUND OF THE INVENTION

1. Field of the Invention

The present invention relates to a semiconductor device and, more particularly, its element on bonding a semiconductor chip on a mount body.

2. Description of the Prior Art

FIG. 3 shows in perspective a semiconductor chip 30 for a light amplification by stimulated emission of radiation (LASER) obtained by using a substrate 4 of N type gallium arsenide (GaAs). Referring to FIG. 3, on top of the upper face of the substrate 4 are applied an N type cladding layer 6, an N type activation layer 8, a P type first cladding layer 10, an N type current-blocking layer 12, a P type second cladding layer 14 and a P type cap layer 16 in this order. On the cap layer 16 is applied a chip positive electrode 32 and on the lower face of the substrate 4 is applied a chip negative electrode 34. In this type of LASER chip 30, the N type activation layer 8 can emit light.

This LASER chip 30 is fixed on a sub-mount body 62 as shown in FIG. 1. A heat sink (not shown) is necessary to work the LASER chip 30. The sub-mount body 62 consists of a conductive substrate 36 with silicon, an insulating layer 38 of silicon oxide on the substrate 36, a connecting electrode 40 on the lower face of the substrate 36, and a negative electrode (not shown) and a positive electrode on the upper face of the substrate 36. A connecting electrode 40 of the sub-mount body 62 is attached to the heat sink. A chip positive electrode 32 of the LASER chip 30 connects with the positive electrode 42 of the sub-mount body 62. The chip negative electrode 34 of the LASER chip 30 connects with the substrate 36 of the sub-mount body 62 via a golden wire 46.

Therefore, when an electric current travels through the positive electrode 42, a bonding connector 70, the chip positive electrode 32, the chip negative electrode 34, the golden wire 46, the substrate 36 and the connecting electrode 40, the LASER chip 30 can emits light.

A process of fixing the LASER chip 30 on the positive electrode 42 will be described with reference to FIG. 1. First of all, the LASER chip 30 connects with the positive electrode 42 via the bonding connector 70. After the bonding connector 70 is melted by heating the bonding connector 70 becomes stiff again. At that time, the LASER chip 30 is fixed to the positive electrode 42 by the bonding connector 70.

However, the above-mentioned semiconductor device have the following problem.

When the volume of the bonding connector 70 is not enough to fix the LASER chip 30, the bonding connector 70 is not strong to hold the LASER chip 30. Specifically, A vibration or the like makes the LASER chip 30 apart from the sub-mount body 62.

Conversary when the volume of the bonding connector 70 is too much the bonding connector 70 melts and transform into a shape shown in dotted lines α and β of FIG. 1 at the heating, and may become stiff with the shape. When the bonding connector 70 transforms into such as shown in the dotted line α of FIG. 1, the LASER chip 30 can not generate light of a desired intensity because the transformed bonding connector covers a place where light is to emit. When that is worse the LASER chip 30 can generate no light because a short circuit is generated in P-N junction of the LASER chip 30. When the bonding connector 70 transforms into such as shown in the dotted line β of FIG. 1 the LASER chip 30 can generate no light because a short circuit is generated between the positive electrode 42 of the sub-mount body 62 and the silicon substrate 36.

SUMMARY OF THE INVENTION

Accordingly, it is an object of the present invention to provide a semiconductor device wherein a semiconductor chip is fixed on a mount body without a short circuit.

A semiconductor device according to one embodiment of the present invention comprises:

a) a mount body having a concavity,
b) a bonding connector, and
c) a semiconductor chip fixed on the concavity by the bonding connector.

A semiconductor device according to another embodiment of the present invention comprises:

a) a conductive substrate,
b) an insulating layer applied on the conductive substrate,
c) a conductive layer having a concavity applied on the insulating layer,
d) a bonding connector, and
e) a semiconductor chip fixed on the concavity by the bonding connector.

A semiconductor device according to further another embodiment of the present invention comprises:

a) a mount body,
b) a bonding connector having a first bonding connector and a second bonding connector around the first bonding connector, the first bonding connector being more fluid than the second bonding connector at a certain temperature, and
c) a semiconductor chip fixed on the mount body by the bonding connector.

A semiconductor device according to yet further another embodiment of the present invention comprises:

a) a conductive substrate,
b) an insulating layer on the conductive substrate,
c) a conductive layer on the insulating layer,
d) a bonding connector having a first bonding connector and a second bonding connector around the first bonding connector, the first bonding connector being more fluid than the second bonding connector at a certain temperature, and
e) a semiconductor chip fixed on the conductive layer by a bonding connector, the bonding connector having a first bonding connector and a second bonding connector around the first bonding connector, the first bonding connector being more fluid than the second bonding connector at the temperature of the bonding operation.

A semiconductor device according to yet further another embodiment of the present invention comprises:

a) a mount body having a concavity,
b) a bonding connector having a first bonding connector and a second bonding connector around the first bonding connector, the first bonding connector being more fluid than the second bonding connector at a certain temperature, and
c) a semiconductor chip fixed on the concavity by the bonding connector.

A semiconductor device according to yet further another embodiment of the present invention comprises:

a) a conductive substrate,
b) an insulating layer on the conductive layer,
c) a conductive layer having a concavity on the insulating layer,
d) a bonding connector having a first bonding connector and a second bonding connector around the first bonding connector, the first bonding connector being more fluid than the second bonding connector at a certain temperature, and
e) a semiconductor chip fixed on the concavity by the bonding connector.

The above, and other objects, features and advantages of the present invention will become apparent from the following description read in conjunction with the accompanying drawings, in which like reference numerals designate the same elements.

DETAILED DESCRIPTION OF THE INVENTION

Figure 1:
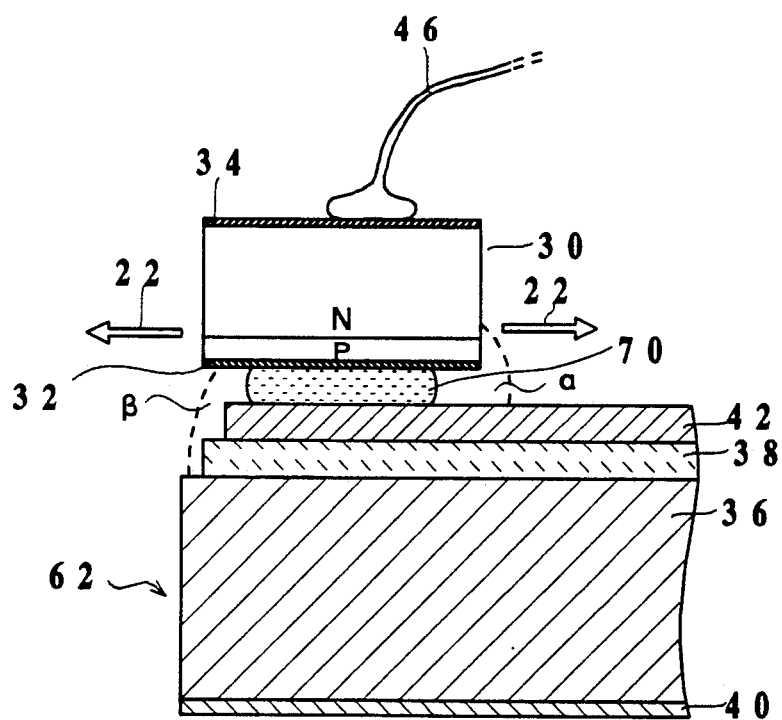
FIG. 1 is a sectional view showing a semiconductor device according to the prior art.
Figure 2:
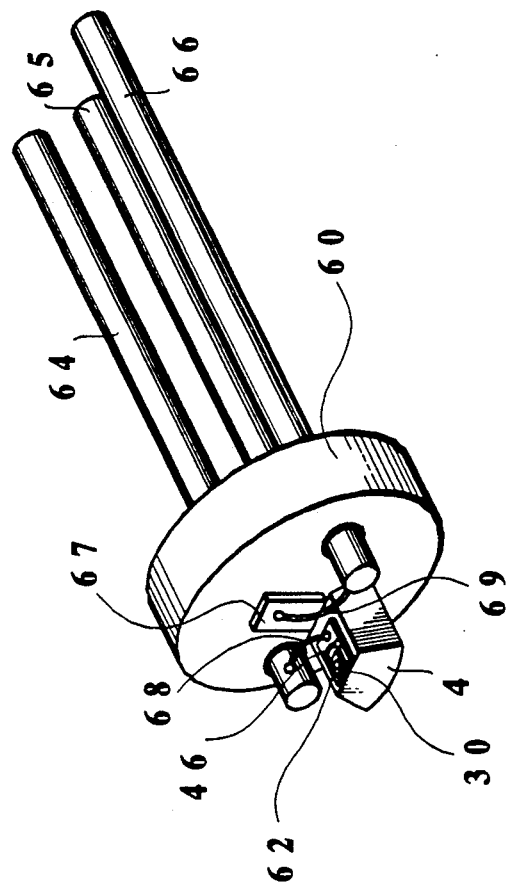
FIG. 2 is a perspective view showing a semiconductor device according to the present invention.

FIG. 2 shows a semiconductor device for a light amplification stimulated by emission of radiation (LASER) according to one embodiment of the present invention in perspective. A cap is not shown in FIG. 2 for simplicity. A heat sink 4 is provided on the surface of a base 60. On the one face of this heat sink 4 is fixed a sub-mount body 62 on which a LASER chip 30 of a semiconductor chip is provided. A lead 65, which is fixed through the base 60, electrically connects with the heat sink 4. The heat sink 4 is electrically connected with a chip negative electrode of the LASER chip 30 through the sub-mount body 62 and a golden wire 46. When a voltage of 0 V is applied to the lead 65 and a positive voltage is applied to the lead 64 the LASER chip 30 can emit light.

Figure 3:
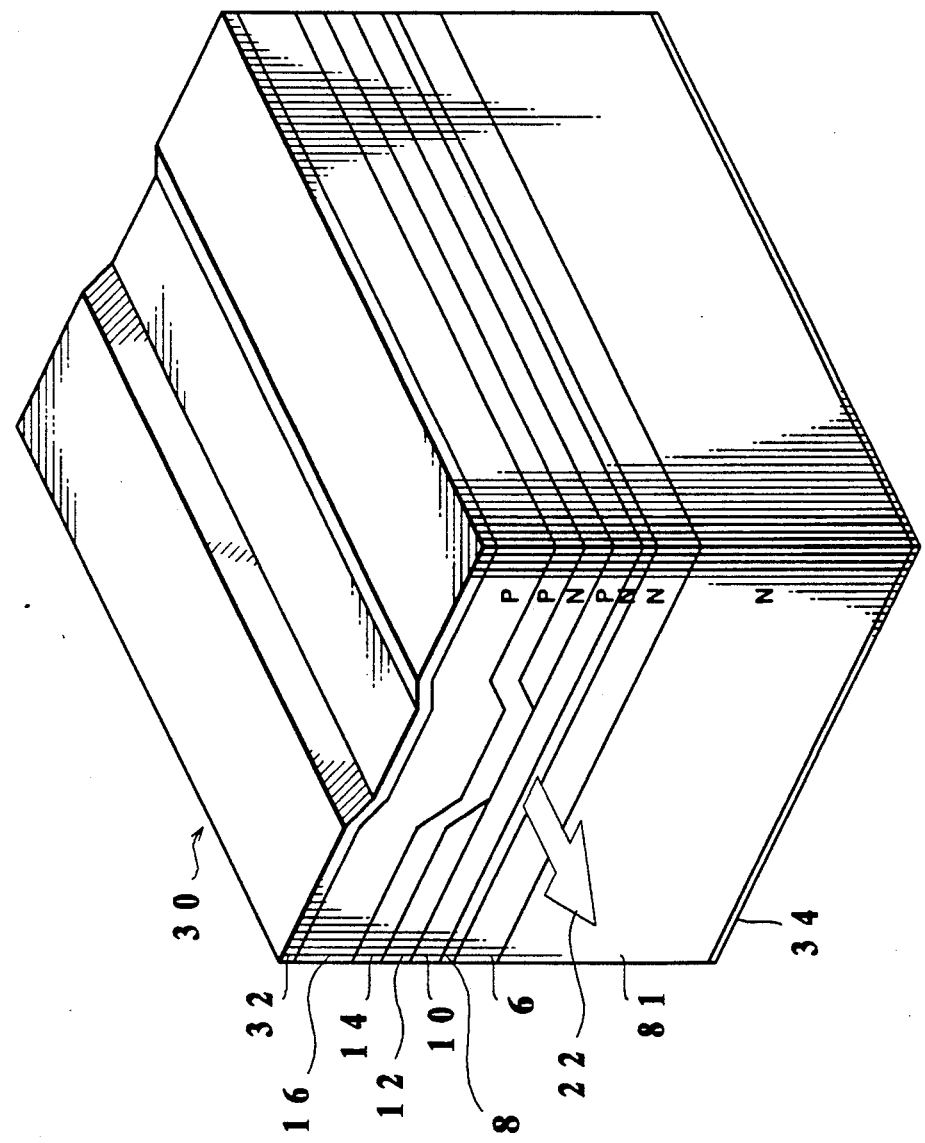
FIG. 3 is a perspective view showing a LASER chip obtained by subjecting a N type substrate to epitaxial growth technique.
Figure 4:
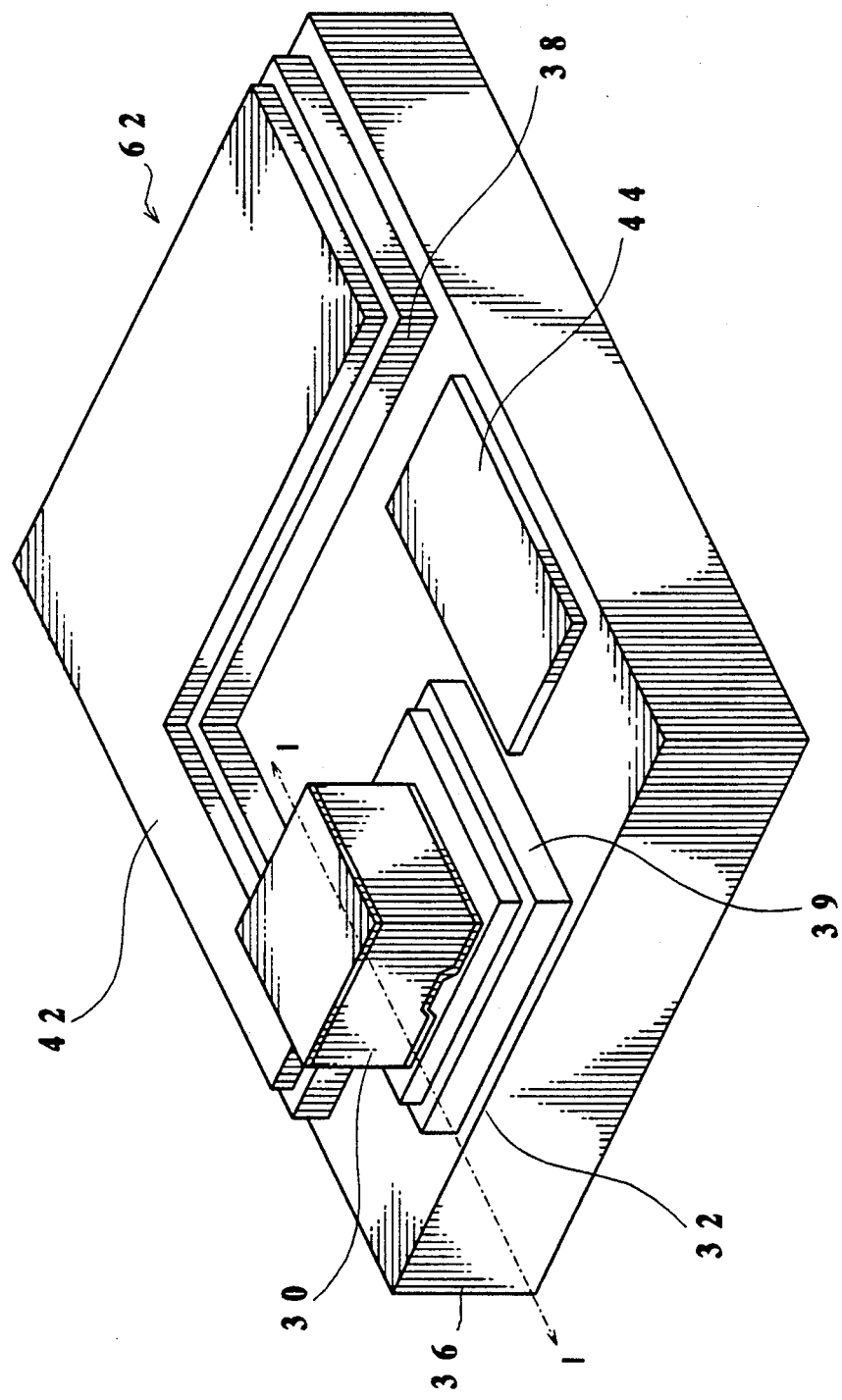
FIG. 4 is a perspective view showing the detail of a sub-mount body.

FIG. 4 shows the detail of the sub-mount body 62 shown in FIG. 2 in perspective. Referring to FIG. 4, on a silicon substrate 36 of a conductive substrate, a silicon oxide layer 38 of an insulating layer is applied. On the silicon oxide layer 38 is applied a positive electrode 42 of aluminum which is a conductive layer. On the upper face of the conductive substrate 36 on which the silicon oxide layer 38 is not applied, a chip negative electrode 44 of aluminum acting as a negative electrode is applied. The LASER chip 30 of FIG. 3 is fixed to the sub-mount body 62 so that a chip positive electrode 32 of the LASER chip 30 is attached to the positive electrode 42 by bonding technique. On the lower face of the silicon substrate 36 is applied an electrode of gold which is to connect with a heat sink (not shown).

Figure 5:
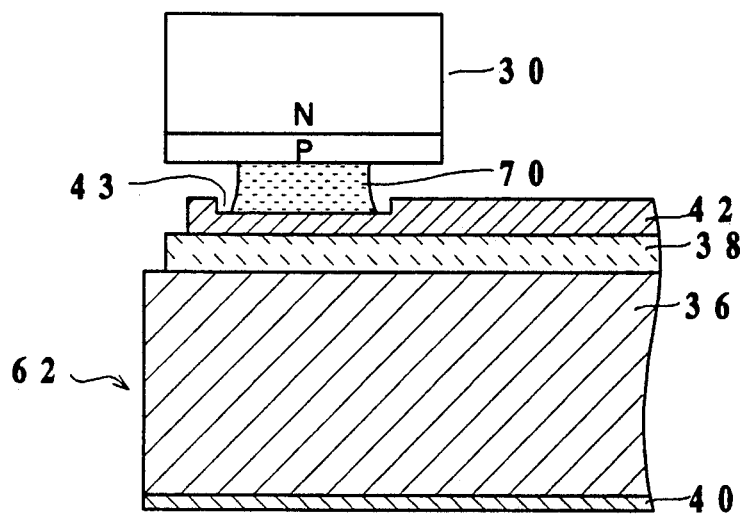
FIG. 5 is a sectional view showing a semiconductor device according to one embodiment of the present invetion.

FIG. 5 is a I—I sectional view of FIG. 4. Note that FIG. 5 shows the LASER chip 30 on the sub-mount body 62 before the bonding according to one embodiment of the present invention. The positive electrode 42 have a concavity 43, on which the bonding connector 70 is set. The LASER chip 30 is set on the bonding connector 70. Therefore, when the bonding connector 70 is melted by heating and then becomes stiff again the LASER chip 30 is fixed to the positive electrode 42. At that time, the bonding connector 70 of liquid does not run over the concavity 43. In other word, there are few case where the bonding connector transforms into a shape indicated by a dotted line α or β.

Figure 7A:
FIGS. 7A through 7E are sectional views showing the manufacturing process of the semicondutor device of FIG. 5.
Figure 7B:
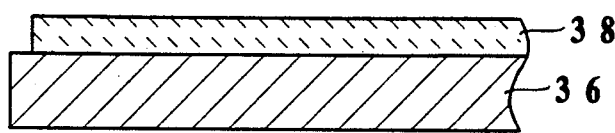
Figure 7C:
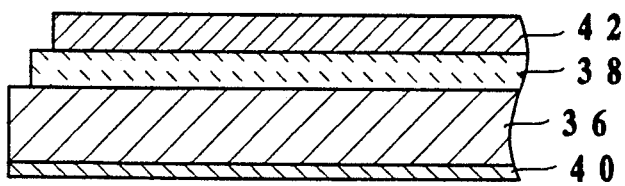
Figure 7D:
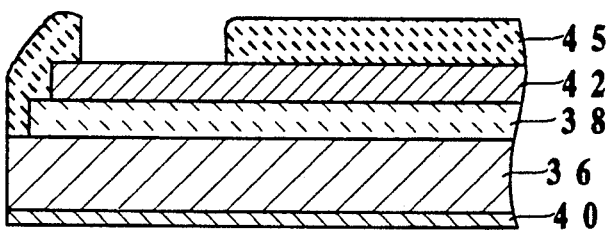
Figure 7E:
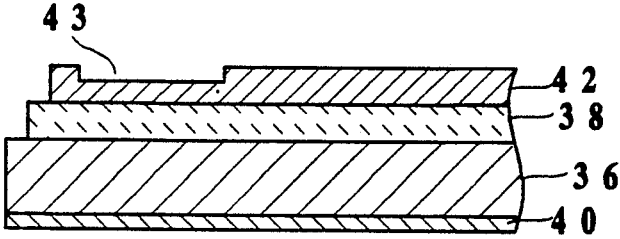
Figure 8A:
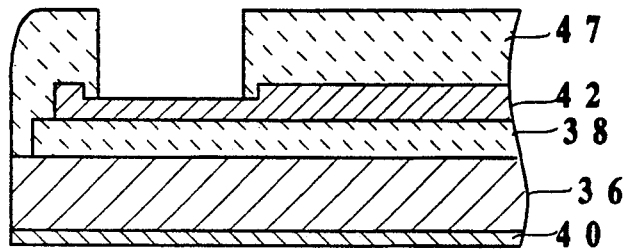
FIGS. 8A through 8C are sectional views showing the manufacturing process of the semicondutor device of FIG. 5.
Figure 8B:
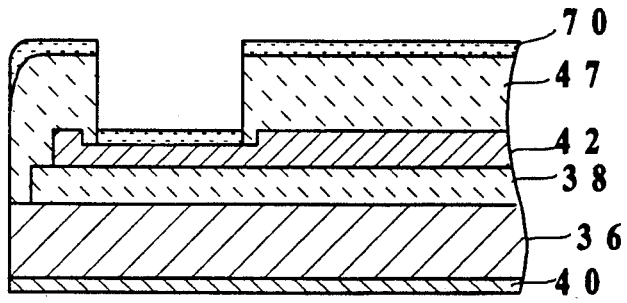
Figure 8C:
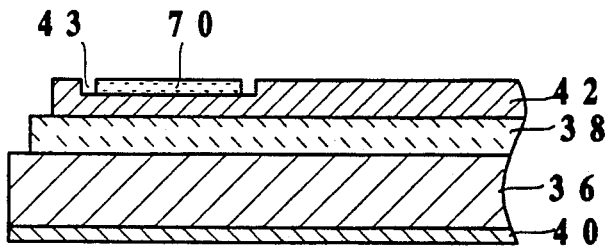

FIGS. 7A though 7E and FIGS. 8A through 8C show processes for manufacturing the semiconductor device of FIG. 5. Referring to FIG. 7A, a silicon substrate 36 of a conductive substrate is prepared. Referring to FIG. 7B, a silicon oxide layer 38 of an insulating layer is formed on the silicon substrate 36 by oxiding the upper face of the silicon substrate 36. Referring to FIG. 7C, a positive electrode 42 of aluminum which is a conductive layer 2.6 μm is applied on the silicon oxide layer 38 and a golden electrode 40 is applied on the lower face of the silicon substrate 36, by vapor deposition technique. Referring to FIG. 7D, to form a concavity 43 a resist pattern 45 is formed on the positive electrode 42. Referring to FIG. 7E, the positive electrode 42 is etched using the resist pattern as a mask and then the resist pattern 45 is removed, so that the concavity 43 is formed. Depth of the concavity 43 can be controlled by time of etching and the other. In the preferable embodiment, the depth of the concavity 43 is 0.5 μm.

Next, a resist pattern 47 shown in FIG. 8A is formed. At that time, a bonding connector 70 is applied on both the resist pattern 47 and the exposed positive electrode 42 by vapor deposition technique. In the preferable embodiment, the bonding connector 70 is 1 μm in thickness made of alloy of gold[90 wt%]-tin[10 wt%]. Referring to FIG. 8C, both the resist pattern 47 and the bonding connector on the resist pattern 47 is removed to remain the bonding connector 70 on the concavity 43. At last, a LASER chip 30 is set on the concavity 43.

Figure 6:
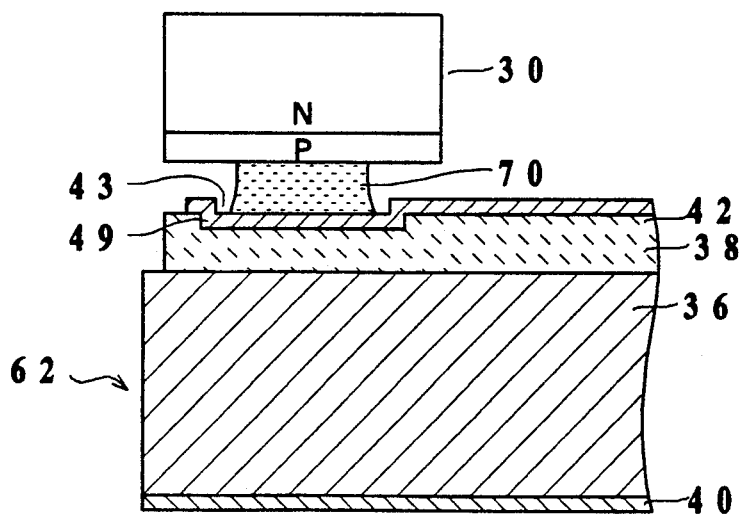
FIG. 6 is a sectional view showing a semiconductor device according to another embodiment of the present invetion.

FIG. 6 shows a semiconductor device according to another embodiment of the present invention. The semiconductor device comprises a silicon oxide layer 38 having a concavity and a positive electrode 42 having a concavity formed accordingly.

Figure 9A:
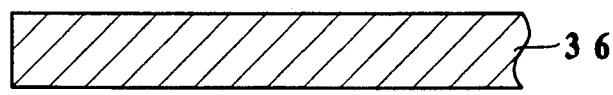
FIGS. 9A through 9E are sectional views showing the manufacturing process of the semicondutor device of FIG. 5.
Figure 9B:
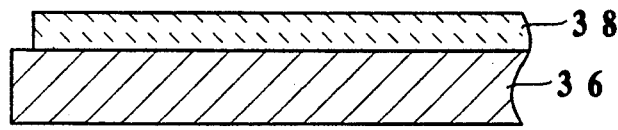
Figure 9C:
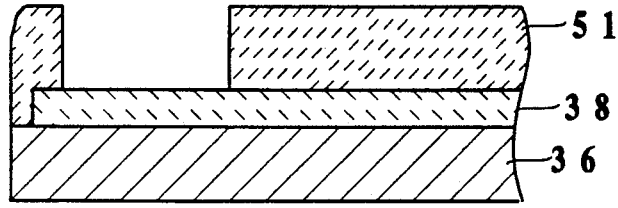
Figure 9D:
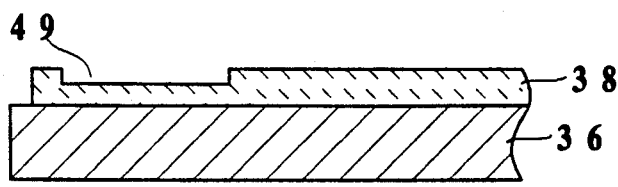
Figure 9E:
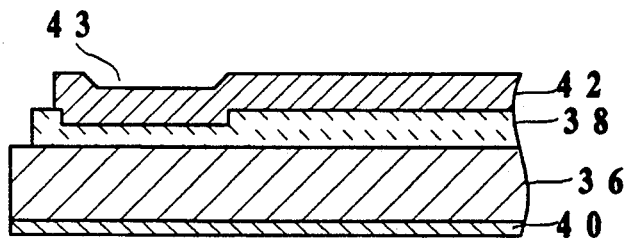

FIGS. 9A through 9E show processes for manufacturing the semiconductor device of FIG. 6. Referring to FIG. 9A, a silicon substrate 36 of a conductive substrate is prepared. Referring to FIG. 9B, a silicon oxide layer 38 of an insulating layer is formed on the silicon substrate 36 by oxiding the upper face of the silicon substrate 36. Referring to FIG. 9C, a resist pattern 51 is formed on the area of the insulating layer except what is to be a concavity 49. Referring to FIG. 9D, the positive electrode 42 is etched using the resist pattern 51 as a mask and then the resist pattern 51 is removed, so that the concavity 49 is formed. Referring to FIG. 9E, a positive electrode 42 of aluminum which is a conductive layer is applied on the silicon oxide layer 38 and a golden electrode 40 is applied on the lower face of the silicon substrate 36, by vapor deposition technique. Note that in this embodiment the concavity of a desired depth can be formed when the thickness of the positive electrode 42 is not more than the desired thickness of the concavity 49.

Figure 10:
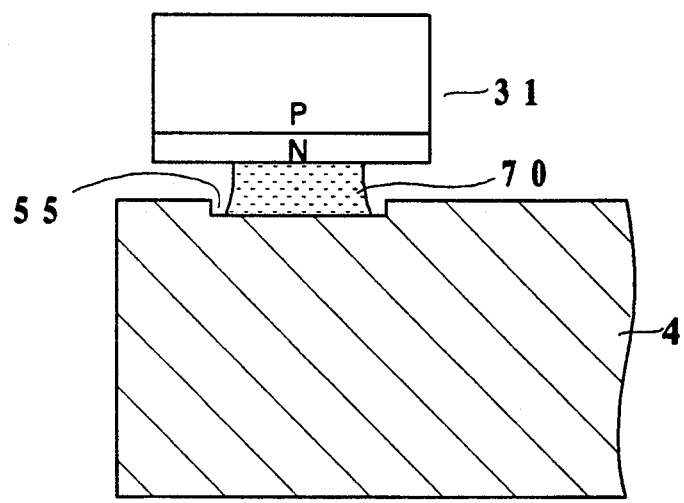
FIG. 10 is a sectional view showing a semiconductor device according to further another embodiment of the prsent invetion.

FIG. 10 shows a semiconductor chip according to further another embodiment of the present invention. In the semiconductor device of FIG. 5 or 6, the mount body on which the LASER chip 30 is fixed is the positive electrode of aluminum on the sub-mount body 62. But when the mount body is a heat sink as the semiconductor device of FIG. 10, or the LASER chip 30 is directly fixed on the heat sink 4 by the bonding technique, the concavity 55 is provide on the heat sink 4.

Figure 11:
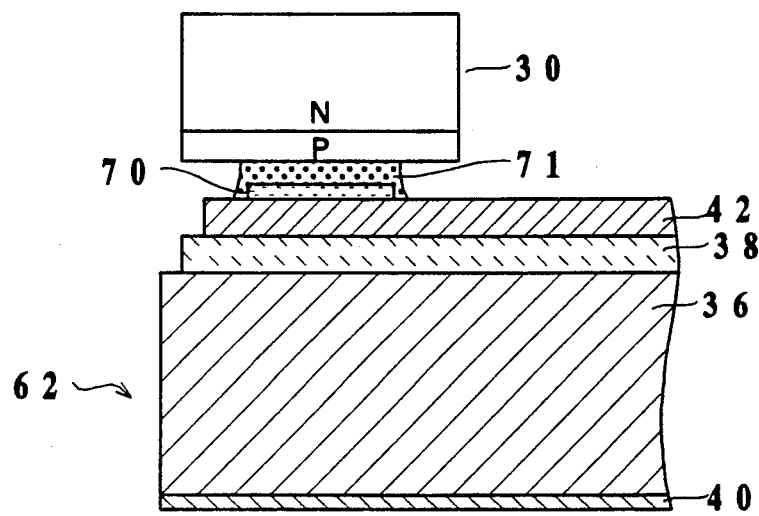
FIG. 11 is a sectional view showing a semiconductor device according to yet further another embodiment present invetion.
Figure 12:
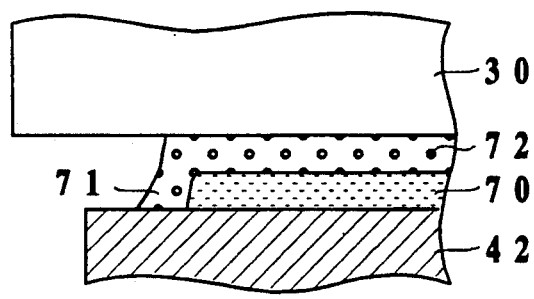
FIG. 12 is a partial sectional veiw showing the detail of the semiconductor device of FIG. 11.
Figure 13A:
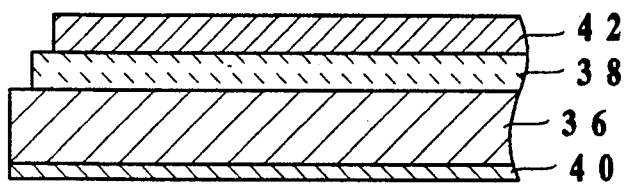
FIGS. 13A. through 13E are sectional views showing the manufacturing process of the semicondutor device of FIG. 11.
Figure 13B:
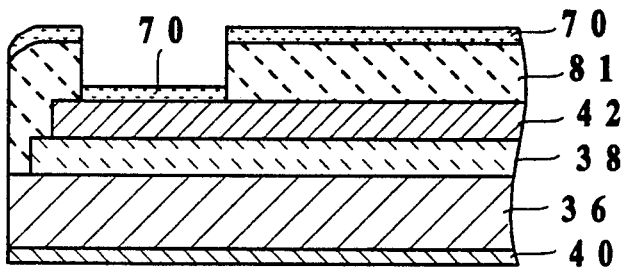
Figure 13C:
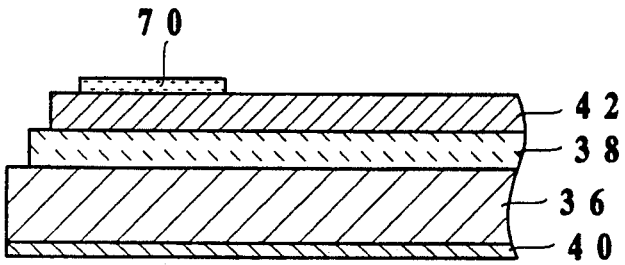
Figure 13D:
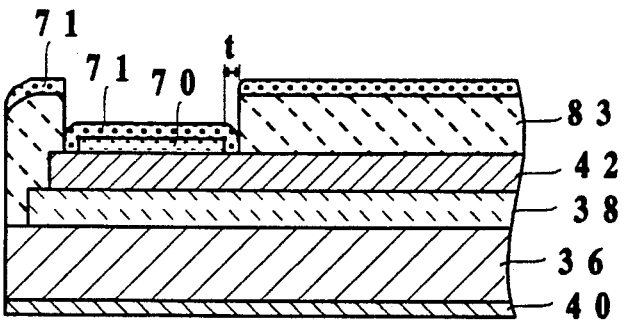
Figure 13E:
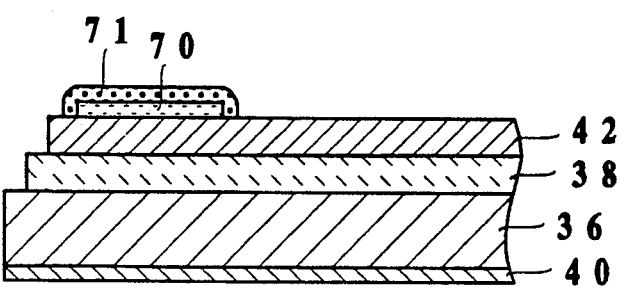

FIG. 11 shows a semiconductor device according to yet further another embodiment of the present invention. In this embodiment, a bonding connector consists a first bonding connector and a second bonding connector. Referring to FIG. 11, the first bonding connector 70 is formed on a positive electrode 42. A second bonding connector 71 cover all the first bonding connector 70. A LASER chip 30 is set on the second bonding connector 71. Note that the first bonding connector 70 is made of the same material as the bonding connector of FIG. 5. Material of the second bonding connector 71 is fluid compared with the material of the first bonding connector 70 at a certain temperature. Also the material of the second bonding connector 71 is porous. Therefore, when heat is applied, the second bonding connector can fix the LASER chip 30 to the positive electrode 42 and prevent fluidity of the first bonding connector 70 because the first bonding connecter run in the holes of the second bonding connector.

FIGS. 13 shows processes for manufacturing the semiconductor device of FIG. 11. Referring to FIG. 13A, on a silicon substrate 36 of a conductive substrate is formed a silicon oxide layer 38 of an insulating layer, on which a positive electrode 42 of aluminum which is a conductive layer is applied on the silicon oxide layer 38. After a resist patter 81 as shown in FIG. 13B is formed on the positive electrode 42 a first bonding connector 70 is applied on both the resist pattern 81 and the exposed positive electrode 42 by vapor deposition technique. In this embodiment, the first bonding connector 70 is 0.5 μm in thickness made of alloy of gold[90 wt%]-tin[10 wt%]. Referring to FIG. 13C, both the resist pattern 81 and the first bonding connector 70 on the resist pattern 47 is removed to remain the bonding connector 70 on the positive electrode 42. Referring to FIG. 13D, a resist pattern 83 is formed on the positive electrode 42 so that there are two spaces T of a few micro meter between the resist pattern and the first bonding connector 70. Thereafter a second bonding connector 71 is applied on the entire surface of the resulting by vapor deposition technique. Referring to FIG. 13E, the resist pattern 83 is removed.

Note that in this embodiment the second bonding connector 71 is 0.5 μm in thickness made of alloy of gold[90 wt%]-tin[10 wt%]. To obtain the second bonding connector 71 which is porous, the second bonding connector 71 have to be applied by vapor deposition technique at speed of ten to twenty angstrom a second. To prevent fluidity of the first bonding connector 71, the certain temperature at heating may be about 220 degrees centigrade.

Figure 14:
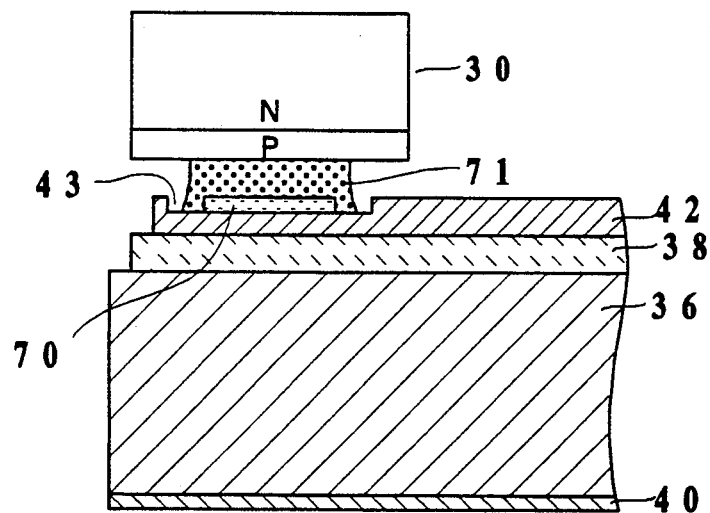
FIG. 14 is a sectional view showing a semiconductor device according to yet further another emvbodiment of the present invetion.

FIG. 14 shows a semiconductor device according to yet further another embodiment of the present invention. In this semiconductor device, a positive electrode 42 having a concavity and a bonding connector consisting of the first bonding connector 71 of FIG. 11 and the second bonding connector 71 of FIG. 11. Therefore, theses fact can prevent a short circuit due to the transformation of bonding connector.

Such a first bonding connector and a second bonding connector as explained in FIG. 11 through FIG. 14 can apply to a case where the LASER chip 30 is fixed directly to the heat sink 4.

Although in the preferable embodiment the present invention applies to the semiconductor device for LASER, in the alternative embodiment the present invention applies to others semiconductor devices.

A semiconductor device according to one embodiment of the present invention is characterized in that a concavity is provided for an area where a LASER chip is to be fixed.

Therefore, when a bonding connector is melted by heating, there are few case where the melted bonding connector run over the concavity and thereby a short circuit is generated.

A semiconductor device according to an other embodiment of the present invention is characterized in that a bonding connector having a first bonding connector and a second bonding connector around the first bonding connector, the first bonding connector being more fluid than the second bonding connector at a certain temperature. Therefore, when the first bonding connector is melted by heating, the second bonding connector prevent the melted first bonding connector from transforming. This fact can prevent a short circuit from being generated.

In the semiconductor device according to the other embodiment of the present invention, the second bonding connector is porous. Therefore, the bonding connector can fix a LASER chip to a positive electrode because the first bonding connecter run in the holes of the second bonding connector.

A semiconductor device according to further anther embodiment of the present invention is characterized in that a concavity is provided for an area where a LASER chip is to be fixed and that a positive electrode 42 has a concavity and a bonding connector has a first bonding connector and a second bonding connector around the first bonding connector, the first bonding connector being more fluid than the second bonding connector at a certain temperature. Therefore, these fact can prevent a short circuit from being generated because the concavity and the second bonding connector prevent the melted first bonding connector from transforming.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A semiconductor device comprising:
    a) a mount body having a concavity,
    b) a bonding connector, and
    c) a semiconductor chip fixed on the concavity by the bonding connector.
2. A semiconductor device according to claim 1, wherein the mount body is a heat sink.
3. A semiconductor device according to claim 1, wherein the mount body is a conductive layer on a sub-mount body.
4. A semiconductor device according to claim 1, wherein the semiconductor chip is a chip for a light amplification by stimulated emission of radiation.
5. A semiconductor device comprising:
    a) a conductive substrate,
    b) an insulating layer applied on the conductive substrate,
    c) a conductive layer having a concavity applied on the insulating layer,
    d) a bonding connector, and
    e) a semiconductor chip fixed on the concavity by the bonding connector.
6. A semiconductor device according to claim 5, wherein the semiconductor chip is a chip for a light amplification by stimulated emission of radiation.
7. A semiconductor device comprising:
    a) a mount body,
    b) a bonding connector having a first bonding connector and a second bonding connector around the first bonding connector, the first bonding connector being more fluid than the second bonding connector at a certain temperature, and
    c) a semiconductor chip fixed on the mount body by the bonding connector.
8. A semiconductor device according to claim 7, wherein the mount body is a heat sink.
9. A semiconductor device according to claim 7, wherein the mount body is a conductive layer on a sub-mount body.
10. A semiconductor device according to claim 7, wherein the semiconductor chip is a chip for a light amplification by stimulated emission of radiation.
11. A semiconductor device according to claim 7 wherein the second bonding connector is porous.
12. A semiconductor device comprising:
    a) a conductive substrate,
    b) an insulating layer on the conductive substrate,
    c) a conductive layer on the insulating layer,
    d) a bonding connector having a first bonding connector and a second bonding connector around the first bonding connector, the first bonding connector being more fluid than the second bonding connector at a certain temperature, and
    e) a semiconductor chip fixed on the conductive layer by the bonding connector.
13. A semiconductor device according to claim 12, wherein the second bonding connector is porous.
14. A semiconductor device according to claim 12, wherein the semiconductor chip is a light amplification by stimulated emission of radiation.
15. A semiconductor device comprising:
    a) a mount body having a concavity,
    b) a bonding connector having a first bonding connector and a second bonding connector around the first bonding connector, the first bonding connector being more fluid than the second bonding connector at a certain temperature, and
    c) a semiconductor chip fixed on the concavity by the bonding connector.
16. A semiconductor device according to claim 15, wherein the mount body is a heat sink.
17. A semiconductor device according to claim 15, wherein the mount body is a conductive layer on a sub-mount body.
18. A semiconductor device according to claim 15, wherein the semiconductor chip is a light amplification stimulated by emission of radiation.
19. A semiconductor device comprising:
    a) a conductive substrate,
    b) an insulating layer on the conductive layer,
    c) a conductive layer having a concavity on the insulating layer,
    d) a bonding connector having a first bonding connector and a second bonding connector around the first bonding connector, the first bonding connector being more fluid than the second bonding connector at a certain temperature, and
    e) a semiconductor chip fixed on the concavity by the bonding connector.
20. A semiconductor device according to claim 19, wherein the semiconductor chip is a light amplification stimulated by emission of radiation.

* * * * *